United States Patent [19]
Yamaguchi

[11] Patent Number: 4,628,016
[45] Date of Patent: Dec. 9, 1986

[54] MIRROR WAFER OF COMPOUND SEMICONDUCTOR

[75] Inventor: Jun Yamaguchi, Hyogo, Japan

[73] Assignee: Sumitomo Electric Industries, Ltd., Osaka, Japan

[21] Appl. No.: 696,578

[22] Filed: Jan. 30, 1985

[30] Foreign Application Priority Data

Feb. 2, 1984 [JP] Japan ............................. 59-13672[U]

[51] Int. Cl.$^4$ .............................................. G03C 5/00
[52] U.S. Cl. ...................................... 430/30; 430/321; 428/901
[58] Field of Search ............... 430/30, 323; 156/659.1; 428/901

[56] References Cited

PUBLICATIONS

"Etch Pits and Dislocations in {100} GaAs Wafers", Journal of Applied Physics, vol. 46, No. 5, May 1975, J. Angillello, R. M. Potemski, and G. R. Woolhouse.

Primary Examiner—John E. Kittle
Assistant Examiner—Patrick J. Ryan
Attorney, Agent, or Firm—Cushman, Darby and Cushman

[57] ABSTRACT

Compound semiconductors belonging to groups III–V have a crystalline structure of the zinc blend type. Wafers sliced from a single crystal ingot on {100} planes have four cleavage planes. Two parallel cleavage planes are equivalent. But two cleavage planes perpendicular with each other are unequivalent. The etching speeds on the unequivalent cleavage planes are different for some pertinent etchant.

A difference of the mesa direction and the reverse-mesa direction along unequivalent cleavage planes exists in compound semiconductors unlike silicon semiconductor.

By an etching process using a pertinent etchant natural anisotropic patterns appear on the rear side of a wafer to denote the mesa direction on the front surface. Natural patterns have generally elongate shapes parallel to each other, resembling lines or ellipsoids. The direction of the longer side is the mesa direction on the front surface. Otherwise artificial parallel patterns can be formed on the rear surface to denote the mesa direction by photoetching process using photoresist and a mask with anisotropic pattern. This invention is especially useful for rectangular or square wafers which do not have orientation flats on the peripheries.

8 Claims, 5 Drawing Figures (a)

(b)

(a)

(b)

MIRROR WAFER OF COMPOUND SEMICONDUCTOR

BACKGROUND OF THE INVENTION

This invention relates to a mirror wafer of a compound semiconductor crystal.

Compound semiconductors of groups III–V are GaAs, InP, GaP, InSb, InAs, GaSb and so on. These semiconductors have a wide scope of applications, for example, for light emitting devices, light detecting devices, high-speed operational devices or other kinds of detecting devices, There is a mesa direction and a reverse-mesa direction on a surface of the wafers of compound semiconductors. These are important directions. A contrivance for knowing the mesa direction is indispensable for semiconductor wafers.

A single crystal of compound semiconductors of groups III–V is grown by a liquid encapsulated Czockralski method (LEC method), or a horizontal Bridgman method.

A single crystal ingot is sliced into many thin raw wafers. The raw wafers are treated with a lapping process, an etching process, a polishing process and so on. After these processes both surfaces or one surface of the wafers become smooth like a mirror. Therefore the wafers with polished surfaces are called mirror wafers to distinguish them from raw wafers.

Wafer-producers forward semiconductor wafers as mirror wafers to wafer-consumers. Wafer-consumers are makers of electronic devices. Device-makers make a great number of identical electronic devices on a mirror wafer by several wafers processes, scribe the wafer many times longitudinally and latitudinally along cleavage planes and divide a wafer into many individual device units. These device units are called semiconductor chips or simply chips. Device-makers encapsulate a chip into a pertinent package, affix leads to the package and make a complete electronic device.

Single crystal of compound semiconductors of groups III–V have a common crystalline structure of zinc blende (ZnS) type, which belongs to a cubic system on crystallography. The crystalline point group is denoted by $\bar{4}3$ m. The upper-lined numeral "$\bar{4}$" means four-fold-with-inversion symmetry. Any lattice sites of the crystalline structure are transformed to identical lattice sites by the operations of a four-fold-rotation around a main axis and an inversion. The crystalline structure lacks four-fold-symmetry.

Because the crystal of the compound semiconductors does not have four-fold-symmetry, it is important to know which is the mesa-direction on both surfaces, when electronic devices shall be formed on a wafer of the compound semiconductors.

Cleavage planes of the crystal of the compound semiconductors are denoted by {110} planes. The numerals 0, 1 or other integer in the parentheses are called plane index. The general representation {110} includes all planes which can be obtained by permutation and inversion of sign starting from (110).

The representations of crystallographical planes and directions are standardized by JEIDA (Japanese Electronics Industries Development Association) as follows.

Wavy bracket { } should denote a general representation of identical planes. Round bracket ( ) should denote an individual representation of a plane. Crooked bracket < > should denote a general representation of identical directions. Square bracket [ ] should denote an individual representation of direction.

However we use round bracket for planes and crooked bracket for directions including both general and individual representations in this specification, partly because there is little possibility to confuse general and individual representations and partly because the standard of JEIDA is not respected even by Japanese scientists.

For example, on the wafer whose front surface is denoted by the (100) plane, the cleavage planes are four planes (011), (0$\bar{1}$1), (01$\bar{1}$) and (0$\bar{1}\bar{1}$) which are perpendicular to the front surface of the wafer. An upper line drawn upon a numeral signifies a minus sign in crystallography. In this case a small bow-shaped part can be cut off from a circular wafer along a cleavage plane. A cord is generated by cutting off of the bow-shaped part. The cord is parallel with one of the four cleavage planes. Thus the cord is called an "orientation flat".

In the case of a compound semiconductor, a single orientation flat is insufficient to identify crystallographic directions, because the crystal of a compound semiconductor lacks four-fold-symmetry. The line <100> is an axis for four-fold-with-inversion symmetry. Crooked parentheses denote a crystallographic direction which is perpendicular to a plane signified by the same numerals bracketed by a set of round parentheses.

Among the four cleavage planes perpendicular to the surface of a (100) wafer, two cleavage planes which are parallel to one another are equivalent. But another two cleavage planes which are perpendicular with each other are unequivalent.

Two different kinds of cleavage planes must be clearly distinguished. Because two perpendicular cleavage planes are unequivalent, mesa direction and reverse-mesa direction exist on a compound semiconductor wafer.

The term "mesa direction" and "reverse-mesa direction" will be now clarified.

A surface of a compound semiconductor wafer is etched by a proper etchant along cleavage planes. The sectional shape etched along a cleavage plane becomes a normal trapezoid whose bottom is wider than the top. This section remaining is called "mesa", because the section resembles a mesa.

But the sectional shape etched along another cleavage planes becomes a reversed trapezoid whose bottom is narrower than the top. This section remaining is called "reverse-mesa".

To identify the mesa direction and reverse-mesa direction on a wafer, the wafer must be etched along cleavage planes. The etching treatment to identify the mesa direction is briefly explained.

Photoresist solution is painted on a wafer to be examined. A photomask plate having a rectangular transparent part (or opaque part) is disposed on the resist-painted wafer. Then the sides of the rectangle of the mask must coincide with the cleavage planes of the wafer. The masked wafer is then exposed to light. The wafer is developed.

A small rectangular resist layer stays on the wafer surface or a wide resist layer remains except a small rectangular part. These results depend whether the rectangle is transparent or opaque in the mask, and whether the photoresist is a positive type or a negative type.

Both cases are equally available for identifying the mesa direction.

FIG. 1 is an enlarged sectional views of a wafer etched along mesa directions. FIG. 1(a) corresponds to the case wherein a small square (or rectangular) resist layer remained and the other part except the resist layer was etched away. FIG. 1(b) corresponds to the case wherein a wide resist layer covered on a wafer except a small square (or rectangular) part and the small uncovered part was etched away.

In any cases the slanting planes etched have upcast perpendiculars (u). Here a perpendicular of a plane is defined as a line which is normal to the plane and is directed outward from the plane.

As shown in FIG. 1(a) we briefly call it "mesa", because the section is a normal trapezoid with a wider bottom. However mesa is sometimes called "V-grooved etch", because the groove of FIG. 1(b) resembles the character V. The slanting planes in FIG. 1 are not easily etched. Etching speed is small on the plane.

FIG. 2 is an enlarged sectional views of a wafer etched along reverse-mesa directions. FIGS. 2(a) and (b) are in the same relation with FIGS. 1(a) and (b). These slanting planes in FIG. 2 are easily etched. Etching progresses rapidly. Therefore the etched planes become downcast slanting planes which have downcast perpendiculars. Although we call it briefly "reverse-mesa" according to the shape of FIG. 2(a), some call it "dove tail etch", because FIG. 2(b) resembles a dove tail.

The reason why we must distinguish the mesa direction and the reverse-mesa direction on a surface of compound semiconductor will now be explained.

Epitaxy, impurity doping, photoetching, evaporation coating of electrodes and other wafer processes are carried out on a wafer for producing FETs, light emitting diode or other electronic devices when some parts of a front surface is etched to make electrodes by evaporation coating process, the electrodes must be formed to cover the step parts generated by the former etching process.

If the step part is a slant edge on the mesa direction, the electrode is well formed on the step part, because thin electrode layer coats on a gently sloping area of the surface.

However if an electrode might be formed on a reverse-mesa edge which has a bottom part narrower than a top part, the electrode would easily be cut, because all of the electrode layer does not contact on the edge tightly. Hence metallic electrodes must be formed on the slant edge etched in a mesa shape.

Besides, the etching speeds along a mesa direction differ from that along a reverse-mesa direction. For these reasons, it is indispensable to determine the mesa and the reverse direction of a wafer before an etching process.

Etched slant planes in FIG. 1 and FIG. 2 are represented by (l m n). Plane indices l, m and n are either of two integers $+1$ and $-1$. We consider how the plane (l m n) is converted by the symmetry operations denoted by the crystalline point group $\bar{4}3$ m. "$\bar{4}$" signifies four-fold-with-inversion symmetry. The rotation axes are $<\pm 1\ 0\ 0>$, $<0 \pm 1\ 0>$ and $<0\ 0\ \pm 1>$. The n-fold symmetry means the rotation of 360/n degrees around some pertinent axis does not change the crystal structure. Inversion is an operation to invert everything with respect to a pertinent point. Thus four-fold-with-inversion operation is a combination of the rotation of 90 degree around an axis and the inversion.

"3" signifies three-fold symmetry around $<1\ 1\ 1>$, $<1\ 1\ \bar{1}>, \ldots$ axes. "m" signifies the mirror symmetry with regard to (1 1 0), (0 1 $\bar{1}$), . . . planes.

An assembly of elements which are converted into another element within the same assembly by any permitted symmetry operations forms an independent group.

By a four-fold-with-inversion symmetry operations, the plane (l m n) is converted to $(\bar{l}\ m\ \bar{n})$, $(\bar{l}\ \bar{m}\ n)$, or $(l\ \bar{m}\ \bar{n})$ plane. By a three-fold symmetry operation, the plane (l m n) is converted to either of (m n l), $(\bar{n}\ \bar{l}\ m), \ldots$ planes. By a mirror symmetry operation the plane (l m n) is converted to $(\bar{l}\ \bar{m}\ n)$, $(\bar{l}\ m\ \bar{n})$ or $(l\ \bar{m}\ \bar{n})$ plane.

The eight planes denoted by (l m n) can be classified into two groups in which the plane indices satisfy the equations $$l\, m\, n = +1 \qquad (i)$$

$$l\, m\, n = -1 \qquad (ii)$$

A plane belonging to group (i) is converted to a plane of group (i) by any symmetry operations. The same relation holds for group (ii). Thus the slant planes succeeding to cleavage planes can be classified into two groups (i) and (ii). This is the reason why mesa direction and reverse-mesa direction appear on a surface of a compound semiconductor wafer.

Two perpendiclars (u) on slant planes are drawn both in FIGS. 1(a) and (b). The direction indices $<l\ m\ n>$ of the perpendiculars are not the same. Thus the planes (l m n) on which perpendiculars $<l\ m\ n>$ stand have not the same plane indices. But all slant planes in FIG. 1 are identical, and belong to either the group (i) or the group (ii).

If all the slant planes in FIG. 1 belong to the group (i), all the slant planes in FIG. 2 must belong to the group (ii).

This means the etching speed on reverse-mesa planes is faster than the etching speed on mesa planes.

Perpendiculars standing upon a front surface and upon a rear surface aim in opposite directions, namely two perpendiculars are antiparallel, because two surfaces are parallel but face opposite directions.

According to the classifications (i) and (ii), mesa directions and revers-emesa directions exchange each other on a front surface or on a rear surface of a wafer. Namely the directions differ by 90 degrees on both sides.

If we assume the front surface of a wafer is a (1 0 0) plane, the rear surface is a ($\bar{1}0\ 0$) plane. The planes belonging to classification (i) are denoted by (l m n) on the front surface. Thus an equation $mn=1$ holds on the front surface. However on the rear surface the planes of classification (i) are denoted by ($\bar{1}$m n).

Thus another equation $mn=-1$ holds on the rear surface. We consider the mesa direction on a wafer by projecting a true mesa direction arrow upon the surface.

Therefore mesa directions on a wafer are designated only by the latter two integers m and n. On the front side two probable sets of indices are m=1, n=1 or m=$-1$, n=$-1$. On the rear side they are m=1, n=$-1$ or m=$-1$, n=1. These are identical directions. Therefore the mesa directions and the reverse-mesa directions exchange on the front or rear side of a wafer.

Mesa directions as well as a cleavage directions must be designated on a compound semiconductor wafer to determine the crystallographical directions.

The conventional designation method uses two orientation flats OF and IF to designate a mesa direction. The orientation flats OF and IF of different lengths are cut along two cleavage planes which are perpendicular to each other. By two discernible orientation flats, operators can determine which is the front surface and which is the mesa direction on the surface.

In the case of silicon wafers a primary flat and a secondary flat are used. The secondary flat is shorter than the primary flat. The secondary flat signifies the electronic property of the silicon wafer.

The IF of the compound semiconductor corresponds to the secondary flat of silicon wafers. But the IF signifies the crystallographical direction instead of the electronic property.

The word "IF" is not accepted in general. But we use the word "IF" because the definition of the IF is clear and distinctive.

The conventional designation method is applicable for circular wafers.

However various shapes of wafers are made and used. Sometimes a large circular wafer is divided into several rectangular or square wafers. In this case because the periphery of the original circular wafer is cut away, the orientation flats are gone. If all peripheral chips were reserved, the orientation flats would be detected by combining the divided wafers and the peripheral chips. But this is not always possible. If possible, it is tedious.

All conventional wafers have the marks to denote a mesa direction only on their periphery. It is totally imposible to determine the mesa direction from any marks or structures in a middle region of a wafer.

SUMMARY OF THE INVENTION

This invention provides a mirror wafer having anisotropic patterns over all the rear surface to designate the mesa directions. The front surface is polished like a mirror as a conventional mirror wafer. The rear surface is not polished but is marked with anisotropic patterns by an etching process or other marking processes.

The mesa direction on the front surface easily be determined from the anisotropic patterns on the rear surface of the wafer.

DETAILED DESCRIPTION OF THE INVENTION

Figure 1:
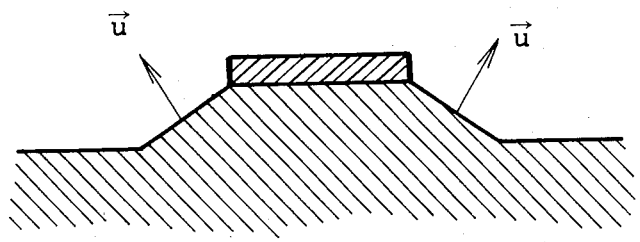
FIG. 1 shows enlarged sectional views of mesa planes etched on a compound semiconductor wafer. (a) is a sectional view wherein a small rectangular part covered by photoresist layer is left unetched. (b) is a sectional view wherein only a small rectangular part uncovered by photoresist layer is etched.
Figure 1:
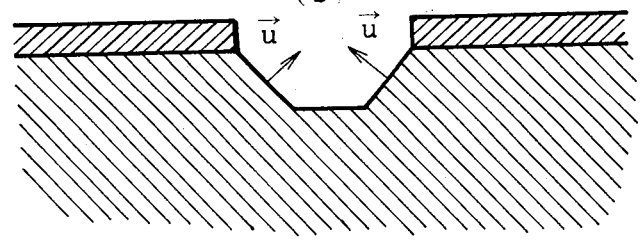
Figure 2:
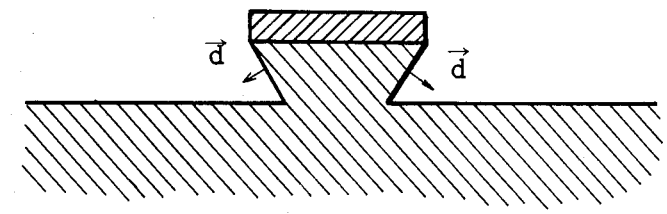
FIG. 2 shows enlarged sectional views of reverse-mesa planes etched on a compound semiconductor wafer. (a) is a sectional view wherein a small rectangular part covered by photoresist layer is left unetched. (b) is a sectional view wherein only a small rectangular part uncovered by photoresist layer is etched.
Figure 2:
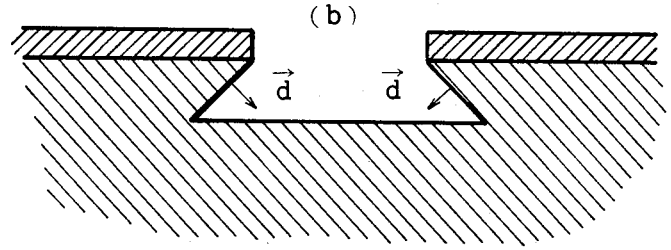
Figure 3:
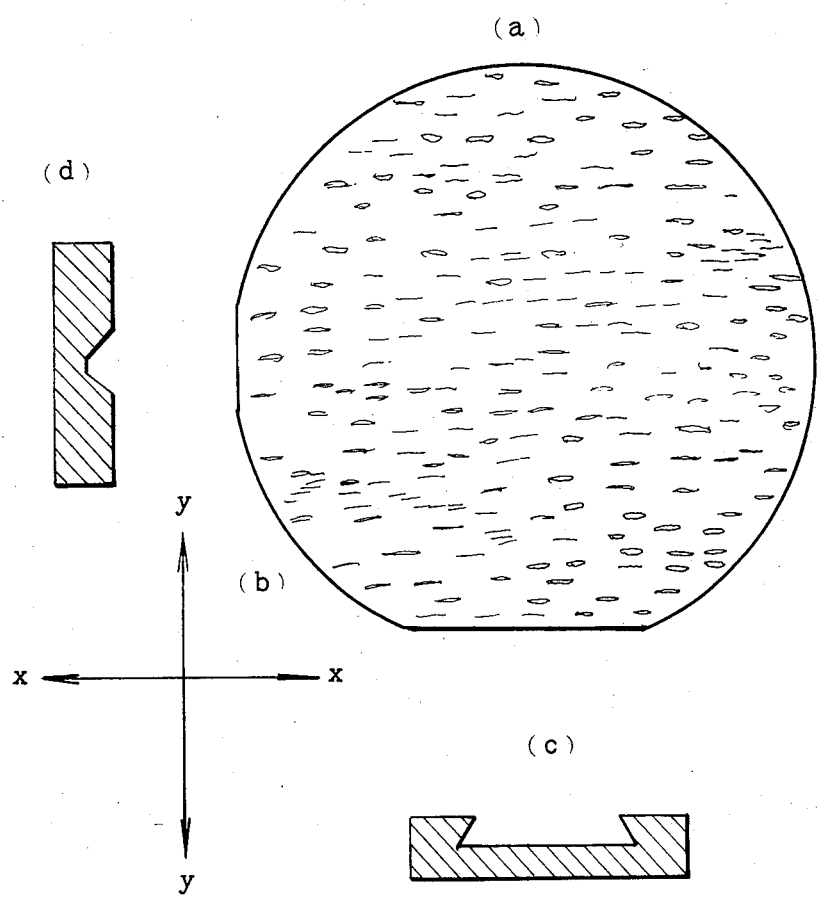
FIG. 3(a) is a plan view of a rear surface of a compound semiconductor wafer etched by some appropriate etchant according to a first embodiment.
FIG. 3(b) is a view of crossed coordinate axes.
FIG. 3(c) is an enlarged sectional view taken along a line parallel with x—x' in FIG. 3(a).
FIG. 3(d) is an enlarged sectional view taken along a line parallel with y—y' in FIG. 3(b).

This invention denotes the mesa direction on a front surface of a wafer by anisotropic patterns appearing on a rear surface of the wafer. These patterns designate both which is the front surface and which is the mesa direction on the front surface. The surface anisotropic patterns cover the entire rear surface. And the anisotropy of the pattern indicates the mesa direction. FIG. 3(a) shows an etching pattern appearing on a rear surface of a GaAs wafer. The etchant used is a special liquid etchant which is a mixture of ammonia and hydrogen peroxide.

The etched surface becomes a rugged surface. Anisotropic patterns appear on the etched surface. Individual patterns have elongate shapes. Individual patterns look like simple short lines or small ellipsoids. Elongate patterns seem to be parallel with one another.

For purposes of illustration, imagine coordinates upon the wafer surface, taking x-axis along a horizontal direction and y-axis along a vertical direction as shown in FIG. 3(b). All individual patterns only stretch along x-axis. They don't stretch along y-axis.

Although there are various sizes of patterns, some of them resemble small ellipsoids, If we deem an individual pattern as an ellipsoid, the x-axis is the longer axis of the ellipsoid.

FIG. 3(c) and FIG. 3(d) show enlarged sectional views of an individual pattern taken along the x-axis and along the y-axis.

From the sectional shapes the direction along x-axis turns out to be the reverse-mesa direction, and the direction along y-axis turns out to be the mesa direction.

Namely if a GaAs wafer is etched by this etchant, anisotropic patterns which are an assembly of parallel elongate patterns appear on the etched surface. One can identify the elongate direction of patterns with the reverse-mesa direction on the surface by a glimpse of the patterns.

The projected mesa direction on the front surface is parallel to the projected reverse-mesa direction on the rear surface. Thus the projected mesa direction on the front surface is along x-axis in this example. Namely the elongate direction of etched patterns on the rear surface is the projected mesa direction on the front surface.

This is a simple rule to learn the mesa direction.

The wafer shown in FIG. 3(a) has two orientation flats OF and IF. It is necessary to know which is the front surface before polishing process. But after a mirror wafer of this invention is produced, the orientation flats are then unnecessary.

The method for making a wafer of the invention will be now explained. As mentioned before, mirror wafers are produced from a single crystal ingot by several processes. An ingot is sliced into many raw wafers (cut wafers). A raw wafer is lapped to a definite thickness. Slicing and lapping processes often cause distortions in the wafer. The wafer is etched to get rid of the distortions. In this etching process a special etchant is used instead of conventional etchant. After etching, anisotropic patterns appear on both surfaces. They signify the mesa or the reverse-mesa directions. Then only the front surface is polished as a mirror. The rear surface is not polished. A one-sided mirror wafer is thus produced.

So far the processes have been explained with regard to GaAs wafers. Processes for other compound semiconductors are the same as with GaAs except the pertinent etchant which marks the anisotropic patterns.

The etchant pertinent for InP wafer is an etchant whose main component is phosphoric acid.

The anisotropic patterns are naturally formed on a rear surface by an etching process using the pertinent etchant. The etchant may be the same as the etchant used to check the mesa and the reverse-mesa directions according to the above mentioned conventional method. As shown in FIG. 3(a), they are natural patterns appearing on the rear surface by nature, which indicate the mesa direction conveniently.

If a pertinent etchant for another compound semiconductors cannot be found artificially marked anisotropic patterns are made all over a rear surface of a wafer by a photoetching process. A mask on which appropriate anisotropic patterns are depicted is put on a photoresist-painted rear surface. Then the masked wafer is exposed to light. The front surface is fully protected by a photoresist layer. Then the wafer is developed, and photoresist is taken off. Anisotropic patterns appears on the rear surface.

Figure 4:
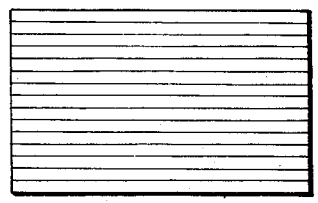
FIG. 4 is a plan view of a rear surface of a rectangular wafer according to a second embodiment of the invention.
Figure 5:
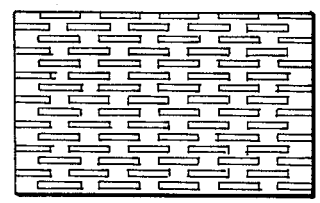
FIG. 5 is a plan view of a rear surface of a rectangular wafer according to a third embodiment of the invention.

The artificial patterns can be arbitrarily chosen. The requirement imposed upon the artificial patterns is only that they should be anisotropic. FIG. 4 and FIG. 5 show examples of anisotropic patterns depicted on rectangular wafers by photoetching process.

In FIG. 4 the anisotropic patterns are only many parallel lines. In FIG. 5 the anisotropic patterns are many small rectangles whose longer sides are parallel with one another.

Of course many other anistropic patterns can be used, as long as they do not give a bad effect to the smoothness of the front surface.

Advantages of the invention will be now explained.

One can easily determine the mesa direction of the wafers which lack orientation flats OF and IF. This invention is especially useful for rectangular wafers or square wafers divided from a wide circular wafer. Even if the original circular wafer had orientation flats, the small divided wafers have no orientation flats.

For rectangular or square wafers it is clear that the four sides of the wafers are cleavage planes. The mesa direction is unknown. The anistropic patterns on the rear surface teach us which is the mesa direction on the front surface.

This invention is applicable for any wafers of various shapes, for example circular wafers, rectangular wafers, square wafers, D-shaped wafers, etc.

What we claim is:

1. A mirror wafer comprising a compound semiconductor wafer having a front surface and a rear surface wherein anisotropic patterns are naturally formed on said rear surface by an etching process, and wherein said wafer has a structure permitting easy determination of the mesa direction.

2. A mirror wafer as claimed in claim 1, wherein the wafer is a GaAs wafer, and the etchant used in the etching process is a mixture of ammonia and hydrogen peroxide.

3. A mirror wafer as claimed in claim 1, wherein the wafer is an InP wafer, and the etchant used in the etching process is an etchant whose main component is phosphoric acid.

4. A mirror wafer as claimed in claim 1, wherein the wafer is a rectangular wafer.

5. A mirror wafer as claimed in claim 1, wherein the wafer is a square wafer.

6. A mirror wafer of compound semiconductor having anisotropic patterns artificially formed on the rear surface by a photoetching process for denoting the mesa direction.

7. A mirror wafer as claimed in claim 6, wherein the anisotropic patterns are many parallel lines.

8. A mirror wafer as claimed in claim 6, wherein the anisotropic patterns are many small parallel rectangles.

* * * * *